United States Patent [19]

Young et al.

[11] 4,350,537
[45] Sep. 21, 1982

[54] SEMICONDUCTOR ANNEALING BY PULSED HEATING

[75] Inventors: John M. Young, Harlow; Peter D. Scovell, Chelmsford, both of England

[73] Assignee: ITT Industries Inc., New York, N.Y.

[21] Appl. No.: 195,688

[22] Filed: Oct. 9, 1980

[30] Foreign Application Priority Data

Oct. 17, 1979 [GB] United Kingdom ............... 7936041
Jul. 29, 1980 [GB] United Kingdom ............... 8024758

[51] Int. Cl.³ .................... H01L 21/265; H01L 21/26
[52] U.S. Cl. ........................................ 148/1.5; 29/585;
29/586; 148/187; 357/91; 427/53.1
[58] Field of Search ............... 148/1.5, 187; 357/91;
427/53.1; 219/10.57; 29/585, 586

[56] References Cited

U.S. PATENT DOCUMENTS 4,151,008  4/1979  Kirkpatrick ..................... 148/1.5
4,154,625  5/1979  Golovchenko et al. ......... 148/175

OTHER PUBLICATIONS

Cohen et al. Appl. Phys. Letts. 33, (Oct. 1978), 751.
Ryssel et al. in Ion Implantation in Semiconductors, Ed. S. Namba, Plenum, N.Y. 1974, pp. 169-176.
Dearnaley et al. (Eds.), Ion Implantation North-Holland, 1973, pp. 421-427.
Bomke et al. Appl. Phys. Letts., 33, (1978), 955.

*Primary Examiner*—Upendra Roy
*Attorney, Agent, or Firm*—John T. O'Halloran; Peter C. Van Der Sluys

[57] ABSTRACT

A process for annealing crystal damage in ion implanted semiconductor devices in which the device is rapidly heated to a temperature between 450° and 900° C. and allowed to cool. It has been found that such heating of the device to these relatively low temperatures results in rapid annealing. In one application the device (17) may be heated on a graphite element (14) mounted between electrodes (15) in an inert atmosphere in a chamber (11). The process may be enhanced by the application of optical radiation from a Xenon lamp (19).

8 Claims, 1 Drawing Figure

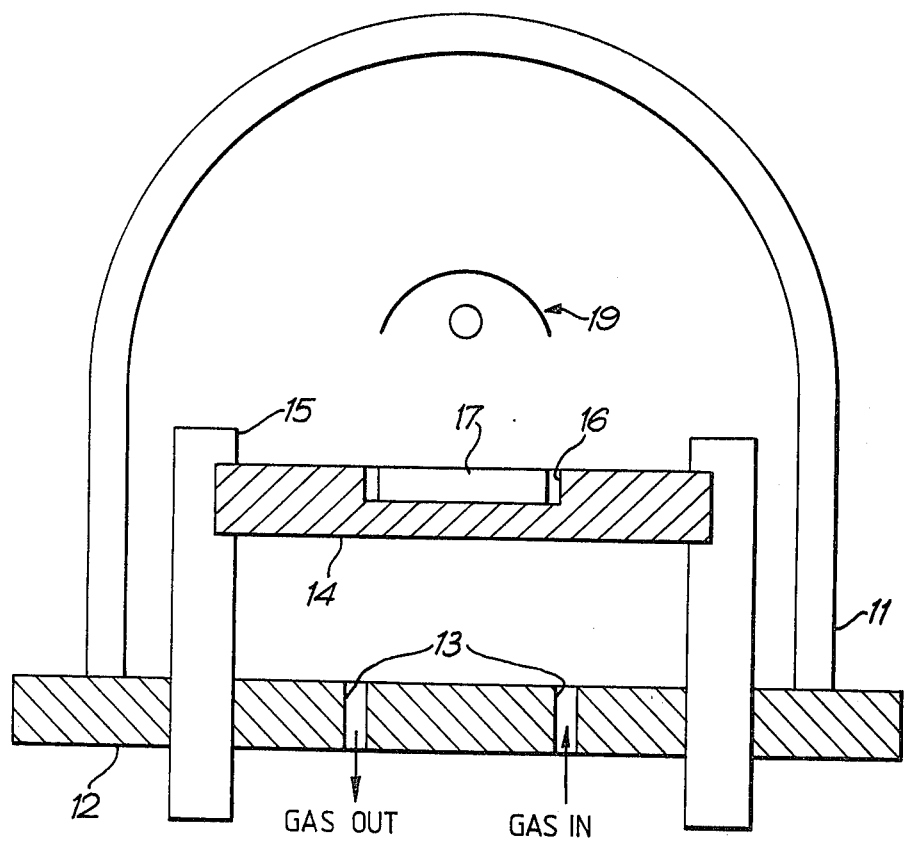

SEMICONDUCTOR ANNEALING BY PULSED HEATING

This invention relates to processing for annealing ion implantation damage in semiconductor devices and to apparatus for effecting such annealing.

Ion implantation has become a widely used technique in the fabrication of semiconductor devices. In this technique a semiconductor body is bombarded in vacuum with ions of an element with which the semiconductor body is to be doped. These ions penetrate the semiconductor crystal lattice and form a buried layer the depth of which is determined by the original ion energy.

During the ion implantation process the semiconductor crystal lattice is damaged and it is therefore necessary to anneal out this damage before further semiconductor processing can be effected. Conventionally this is done by maintaining the semiconductor body at an elevated temperature, e.g. 900° to 1100° C. for an extended time during which recrystallisation occurs. Such a process is of course time consuming and limits the rate of device throughput. Further, the high temperatures and extended times involved can lead to undesirable diffusion of the dopant.

The object of the invention is to minimise or to overcome this disadvantage.

According to one aspect of the invention there is provided a process for annealing an ion damaged semiconductor body, including pulse heating the body to a temperature within the range in which the sheet resistivity of the semiconductor falls to a minimum value.

According to another aspect of the invention there is provided a method of processing a semiconductor body, including ion implanting a dopant species whilst maintaining the body at ambient temperature, and annealing the body by pulse heating the body to a temperature within the range in which the sheet resistivity of the ion implanted semiconductor falls to a minimum value.

According to a further aspect of the invention there is provided a semiconductor annealing apparatus, including a sealable enclosure, means for providing an inert atmosphere with the enclosure, electrically conductive support means for one or more semiconductor boides mounted within the chamber, and means for supplying an electric current through the support means so as to raise the temperature of the support together with one or more semiconductor bodies mounted thereon to the annealing temperature of the semiconductor.

We have found that the sheet resistivity of an arsenic ion implanted layer in a silicon body is not a linear function of the annealing temperature, but has a definite minimum value at a temperature between 450° and 600° C. The sheet resistivity shows a slow rise with increasing temperature up to about 750° C. and then falls again at 800° to 900° C., this latter temperature being that employed in the conventional annealing process. Furthermore, we have established that, at the relatively low temperatures we employ, a rapid excursion to the annealing temperature is sufficient to effect the desired annealing process.

Embodiments of the invention will now be described with reference to the accompanying drawings in which the single FIGURE is a schematic diagram of a semiconductor pulse annealing apparatus.

Referring to the drawing the apparatus includes a chamber, e.g. a glass bell jar 11, supported on a base plate 12 provided with openings 13 whereby the bell jar may be purged with an inert gas, e.g. nitrogen. Within the bell jar 11 a conductive, typically graphite, heater element 14 is mounted between a pair of electrodes 15. The heater element 14 is provided with a circular recess 16 of suitable dimensions for receiving a semiconductor wafer 17 to be annealed. The apparatus may also include a high power Xenon lamp 19 mounted above the heater element 14.

A silicon process wafer 17 to be annealed is placed in the recess 16 in the heater element 14, and the chamber 11 is purged with inert gas via openings 13. A heavy current, typically 100-500 amp, is passed through the element 14 so as to raise its temperature and the temperature of the wafer from ambient to between 500° and 600° C. This temperature rise should be achieved rapidly and the heater element 14 should therefore have a low thermal mass. We have found that a temperature rise to 500° C. can be achieved within 20 to 30 seconds. When the element 14 has reached the desired temperature the current is switched off and the element and wafer are allowed to cool. We have found that ion implanted silicon wafers treated to such a temperature profile anneal rapidly. The optimum annealing temperature may depend on the nature of the implanted ion and the extent of the crystal damage. In practice this temperature may be determined empirically. In a typical process employing 30 ohm cm single crystal polished silicon implanted with 150 keV arsenic ions to a level of $6 \times 10^{15}$ cm$^{-2}$ it was found that annealing was effected by such a pulse heating to 600° C. the maximum temperature being maintained for 30 seconds.

Exposure of a silicon wafer to ion implantation produces a damaged surface layer which can be observed from the optical interference colour it produces. The visual appearance of such a silicon surface is similar to that of a metal with a very thin surface oxide layer. When the silicon is annealed the surface damage is repaired and the interference colour therefore disappears. Using the low temperature thermal pulse technique described herein the annealing process can be followed by observing the wafer surface through a suitably placed long focus microscope.

In some applications the thermal pulse technique may be suplemented by exposing the wafer 14 to radiation from a high power Xenon lamp 19. In such an arrangement the heater element 14 is raised to a somewhat lower temperature than before, the final annealing then being achieved by optical pulses from the Xenon lamp.

In a further embodiment of the invention a temperature excursion to 700° C. in the form of a triangular pulse (i.e. not maintaining the temperature at 700° C.) has been found sufficient to regrow the damaged layer and activate the implanted arsenic. Because this process is extremely fast, no de-activation of the arsenic occurs due to thermal clustering and very low resistivities are consequently obtained. The experimental sheet resistivities obtained after such a pulse are 31.7 $\Omega/\square \pm 0.5$ $\Omega/\square$ which is very close to the theoretical minimum.

The temperature measurement technique employed must not introduce a heat-sinking effect. In one technique the surface of the sample is painted with colloidal graphite which is a good radiator of radiant energy and an infra-red pyrometer is focussed on the painted area. The system is calibrated by similarly painting a silver plate with a platinum/platinum-rhodium thermocouple embedded in its surface. The silver plate is heated and calibration against the thermocoupled is obtained. The calibration can be checked against the freezing points of aluminium, zinc and tellurium.

The annealing process is not of course limited to the apparatus described in the accompanying drawing. It is merely necessary to provide some means whereby the semiconductor body is heated rapidly to the desired annealing temperature. We have however found that, for this annealing effect to be obtained, it is essential that the silicon body is cooled, i.e. maintained at ambient temperature, during the implantation process. In a continuous production technique, a plurality of process wafers may be traversed rapidly through a furnace, the furnace temperature and the wafer throughput being such that the desired temperature pulse excursion is obtained. In other applications the wafer may be placed for a predetermined time on a hot plate of a material which does not contaminate the semiconductor.

These results show that the pulse annealing technique described herein provides effective annealing in a far shorter period of time than the conventional high temperature furnace technique. Also, by operating within the low temperature end of the annealing/temperature curve as against the conventional techniques which operate at the high temperature end of the curve, undesirable diffusion of the implanted and othr dopants, if any, is avoided.

The following examples illustrate the invention:

EXAMPLE I

A series of 3 inch Czochralski grown p-type (100) 30 ohm cm single crystal silicon wafer was bombarded with arsenic ions at an average energy of 150 keV using an electrostatically scanned beam to produce a sub-surface doping level of $6 \times 10^{15}$ cm$^{-2}$. One set of the wafers was treated to a conventional furnace process at a temperature of 650° C. for 30 minutes.

The remaining wafers were treated to the pulse annealing process described herein. Each wafer was heated to a temperature of 600° C. within 30 seconds, the temperature being maintained at 600° C. for 30 seconds. The sheet resistivity, indicative of the efficiency of the annealing process, was determined for both sets of wafers, the results being summarised in the following table:

| Anneal Process | Sheet Resistivity ohms/square |
|---|---|
| Furnace 650° C. 30 min. | 39.3 ± 0.2 |
| Pulse 600° C. 30 secs. | 30.8 ± 0.2 |

EXAMPLE II

An experiment similar to example I was performed but this time the temperature of the second set of wafers was raised rapidly to 700° C. from whence it was immediately allowed to cool to room temperature. The results are summarised below:

| Anneal Process | Sheet Resistivity ohms/square |
|---|---|
| Furnace 650° C. 30 min. | 39.3 ± 0.2 |
| Triangular Pulse to 700° C. | 31.7 ± 0.5 |

These examples demonstrate that the annealing techniques described herein produce results comparable to conventional furnace annealing process and in a very much reduced period of time.

We claim:

1. A method of annealing an ion damaged semiconductor body, including contacting the body with a heater element of low thermal mass, pulse heating the body by raising the temperature of the heater element and the body to 450° to 900° C. so as to effect annealing, and allowing the element and the body to cool.

2. A method as claimed in claim 1, and in which the semiconductor is silicon.

3. A method as claimed in claim 1, and in which the temperature is raised to 450° to 900° C. within 20 to 30 seconds.

4. A method as claimed in claim 1, wherein the body is treated with a substantially triangular thermal pulse, the peak temperature of which is about 700° C.

5. A method as claimed in claim 1, wherein the pulse heating of the body is accomplished solely by thermal heating through the use of said heater element.

6. A method as claimed in claim 2, and in which the semiconductor body is ion implanted with arsenic.

7. A method as claimed in claim 3, and wherein the temperature of the body is maintained at the elevated temperature for about 30 seconds.

8. A method of processing a semiconductor body, including ion implanting a dopant species whilst maintaining the body at ambient temperature, and annealing the body by pulse heating the body with a substantially triangular thermal pulse, the maximum temperature of which is about 700° C.

* * * * *